US011820095B2

(12) United States Patent
Schivalocchi

(10) Patent No.: US 11,820,095 B2
(45) Date of Patent: Nov. 21, 2023

(54) SINTERING PRESS FOR SINTERING ELECTRONIC COMPONENTS ON A SUBSTRATE

(71) Applicant: AMX—AUTOMATRIX S.R.L., Gavardo (IT)

(72) Inventor: Nicola Schivalocchi, Gavardo (IT)

(73) Assignee: AMX—AUTOMATRIX S.R.L., Gavardo (IT)

(*) Notice: Subject to any disclaimer, the term of this patent is extended or adjusted under 35 U.S.C. 154(b) by 402 days.

(21) Appl. No.: 17/293,689

(22) PCT Filed: Dec. 17, 2019

(86) PCT No.: PCT/IB2019/060922
§ 371 (c)(1),
(2) Date: May 13, 2021

(87) PCT Pub. No.: WO2020/128832
PCT Pub. Date: Jun. 25, 2020

(65) Prior Publication Data
US 2022/0001637 A1 Jan. 6, 2022

(30) Foreign Application Priority Data
Dec. 20, 2018 (IT) .................. 102018000020275

(51) Int. Cl.
*B23K 20/02* (2006.01)
*B30B 15/34* (2006.01)
*H01L 23/00* (2006.01)

(52) U.S. Cl.
CPC ............. *B30B 15/34* (2013.01); *B23K 20/02* (2013.01); *H01L 24/83* (2013.01);
(Continued)

(58) Field of Classification Search
CPC ...... B30B 15/34; B30B 15/064; B30B 15/067; H01L 24/83; H01L 2224/83097;
(Continued)

(56) References Cited

U.S. PATENT DOCUMENTS 3,619,896 A * 11/1971 Paine ................... B23K 20/025
228/262.6
4,087,037 A * 5/1978 Schier .................. B21D 26/055
72/63
(Continued)

FOREIGN PATENT DOCUMENTS

CN 1434329 A * 8/2003 ............ H01L 24/75
CN 101137458 A * 3/2008 ........... B23K 20/023
(Continued)

OTHER PUBLICATIONS

International Search Report, issued in PCT/IB2019/060922, dated Feb. 21, 2020, Rijswijk, Netherlands.

*Primary Examiner* — Kiley S Stoner
(74) *Attorney, Agent, or Firm* — ArentFox Schiff LLP; Michael Fainberg

(57) ABSTRACT

A sintering press for sintering electronic components on a substrate is provided. The sintering press includes a pressing unit having a plurality of controllable presser rods to apply sintering pressure to the electronic components to be sintered, reaction elements forming a support plane for a respective substrate, an element plate slidably supporting the reaction elements, and a heating circuit with heating elements embedded in a heating body placed around the element plate to bring the element plate to a sintering temperature. A heat diffusion plate is placed in contact with the heating body and extends onto the element plate between the reaction elements, the diffusion plate being made of a material having a higher thermal conductivity than the element plate.

12 Claims, 4 Drawing Sheets

(52) U.S. Cl.
CPC ............... *H01L 2224/8384* (2013.01); *H01L 2224/83097* (2013.01); *H01L 2224/83203* (2013.01)

(58) Field of Classification Search
CPC ... H01L 2224/83203; H01L 2224/8384; H01L 2224/75251; H01L 2224/75301; H01L 2224/75501; H01L 2224/7598; H01L 2224/75984; H01L 24/95; H01L 2224/32225; H01L 2224/7531; H01L 2224/75981; H01L 2224/95; H01L 24/75; H01L 24/32; H01L 2224/75252; H01L 224/75901; B23K 20/00–04
USPC .............. 228/6.1–6.2, 5.5, 234.1, 235.1
See application file for complete search history.

(56) References Cited

U.S. PATENT DOCUMENTS

| | | | | |
|---|---|---|---|---|
| 4,607,779 | A | * | 8/1986 | Burns ............... H01L 24/80 228/234.1 |
| 8,703,583 | B2 | * | 4/2014 | Maki ............... H01L 21/6836 438/464 |
| 2005/0061856 | A1 | * | 3/2005 | Maki ............... H01L 23/3128 228/234.1 |
| 2005/0089436 | A1 | * | 4/2005 | Tokita ............... B30B 15/306 419/38 |
| 2005/0232803 | A1 | * | 10/2005 | Kuttler ............... B29C 45/332 419/9 |
| 2008/0190992 | A1 | * | 8/2008 | Jin ............... B23K 20/24 228/176 |
| 2010/0024667 | A1 | | 2/2010 | Ikura |
| 2010/0032096 | A1 | | 2/2010 | Yu et al. |
| 2012/0247664 | A1 | * | 10/2012 | Kobayashi ............... H01L 24/75 156/308.2 |

FOREIGN PATENT DOCUMENTS

| | | | | |
|---|---|---|---|---|
| CN | 105033440 | A | * 11/2015 | |
| CN | 106003783 | A | * 10/2016 | |
| CN | 113305411 | A | * 8/2021 | |
| CN | 216905460 | U | * 7/2022 | ......... H01L 23/3735 |
| CN | 110621503 | B | * 9/2022 | ................ B22F 3/03 |
| EP | 3085486 | A1 | * 10/2016 | ............ B23K 20/02 |
| GB | 2269132 | A | * 2/1994 | ........... B30B 15/064 |
| JP | 2012231080 | A | * 11/2012 | ............ H01L 24/75 |
| JP | 2013012541 | A | | 1/2013 |
| JP | 2014130880 | A | * 7/2014 | ............ H01L 24/75 |
| JP | 2017026505 | A | * 2/2017 | ........ G01R 31/2884 |
| WO | WO-2013035251 | A1 | * 3/2013 | ........... B30B 11/027 |
| WO | 2018122795 | A1 | | 7/2018 |

* cited by examiner

SINTERING PRESS FOR SINTERING ELECTRONIC COMPONENTS ON A SUBSTRATE

CROSS-REFERENCE TO RELATED APPLICATIONS

This application is a National Phase Application of PCT International Application No. PCT/IB2019/060922, having an International Filing Date of Dec. 17, 2019 which claims priority to Italian Application No. 102018000020275 filed Dec. 20, 2018, each of which is hereby incorporated by reference in its entirety.

FIELD OF THE INVENTION

The present invention relates to a sintering press for sintering electronic components on a substrate.

BACKGROUND OF THE INVENTION

As is known, in some electronics applications, integrated electronic components, e.g. diodes, IGBTs, thermistors, MOSFETs, are fixed to a substrate by the interposition of a sintering paste. In order for each component to be sintered correctly, it must be pressed onto the substrate while it is at a sintering temperature, for example greater than 200° C.

A sintering press usually comprises a base that forms a pressing plane on which one or more substrates are positioned. The press is equipped with a pressing unit provided, for each substrate, with one or more presser members controlled for example by a hydraulic circuit to exert a predetermined pressure on the electronic components to be sintered.

In some embodiments of the press, the base is further equipped with one or more load cells suitable to detect the sum of the forces exerted by the presser members on the electronic components for each substrate in order to monitor the correct operation of the press. The load cells are electronic components that must operate at temperatures much lower than the sintering temperature.

One of the problems that afflict sintering presses of the type described above is therefore how to bring the substrates to the temperature suitable for sintering, without overheating other elements of the press that must remain at a much lower temperature, for example the load cells, and in any case without compromising the mechanical performance of the press.

SUMMARY OF THE INVENTION

The object of the present invention is to propose a press capable of solving such a problem.

Said object is achieved by a sintering press as described and claimed herein. Preferred embodiments of the present invention are also described.

BRIEF DESCRIPTION OF THE DRAWINGS

The features and advantages of the sintering press according to the invention will become evident from the description hereinafter of its preferred embodiments, provided by way of indicative and non-limiting examples, with reference to the accompanying figures, wherein.

DETAILED DESCRIPTION

Figure 1:
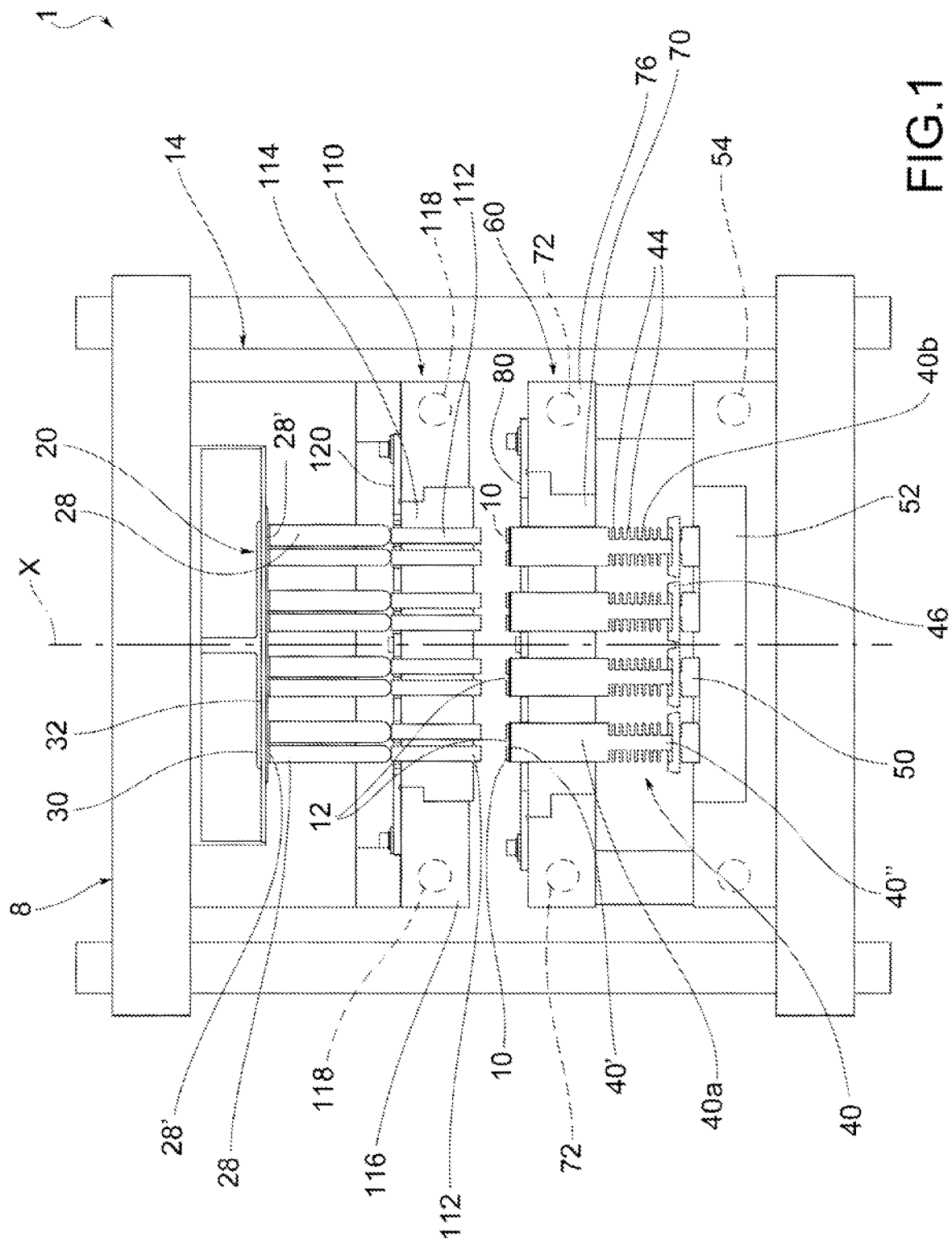
FIG. 1 is an axial section of the press according to the invention.
Figure 2:
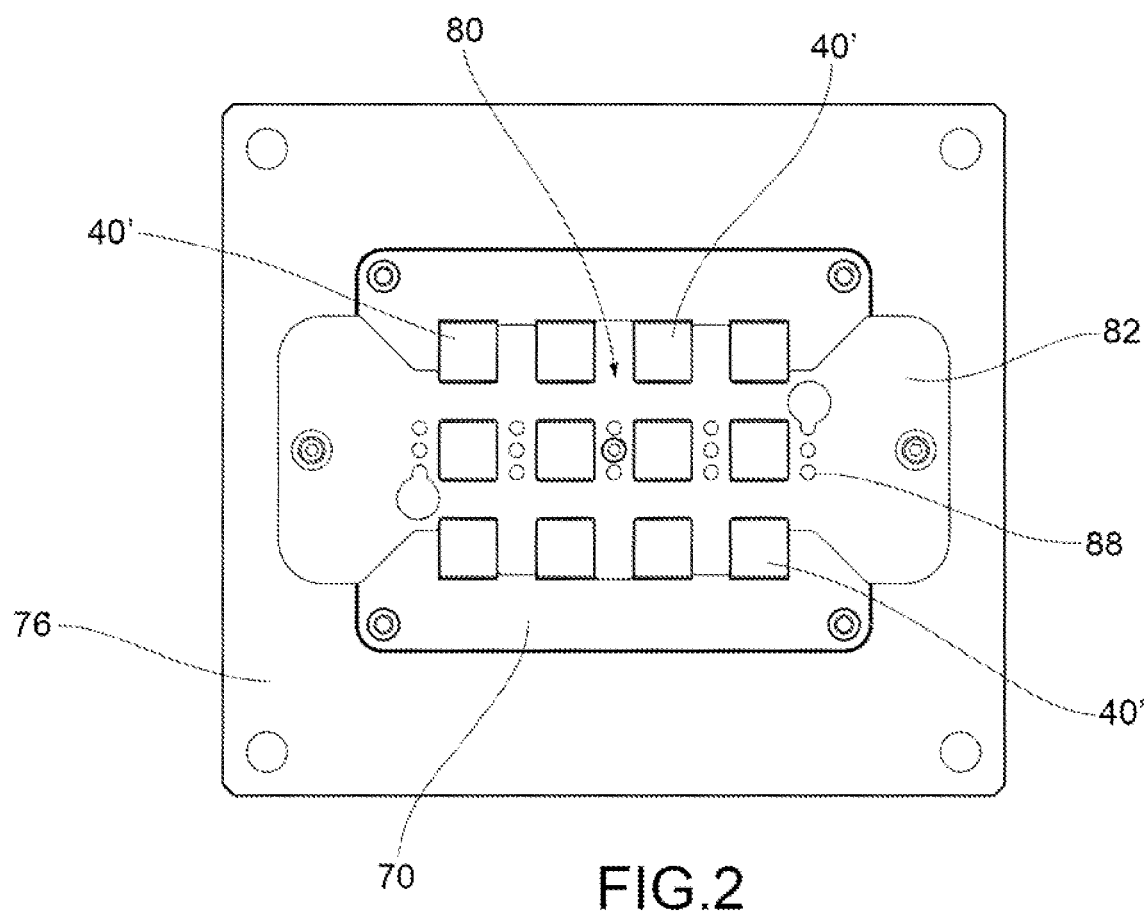
FIG. 2 is a plan view from the top of the element holder plate of the press, fitted with a heat diffusion plate.
Figure 3:
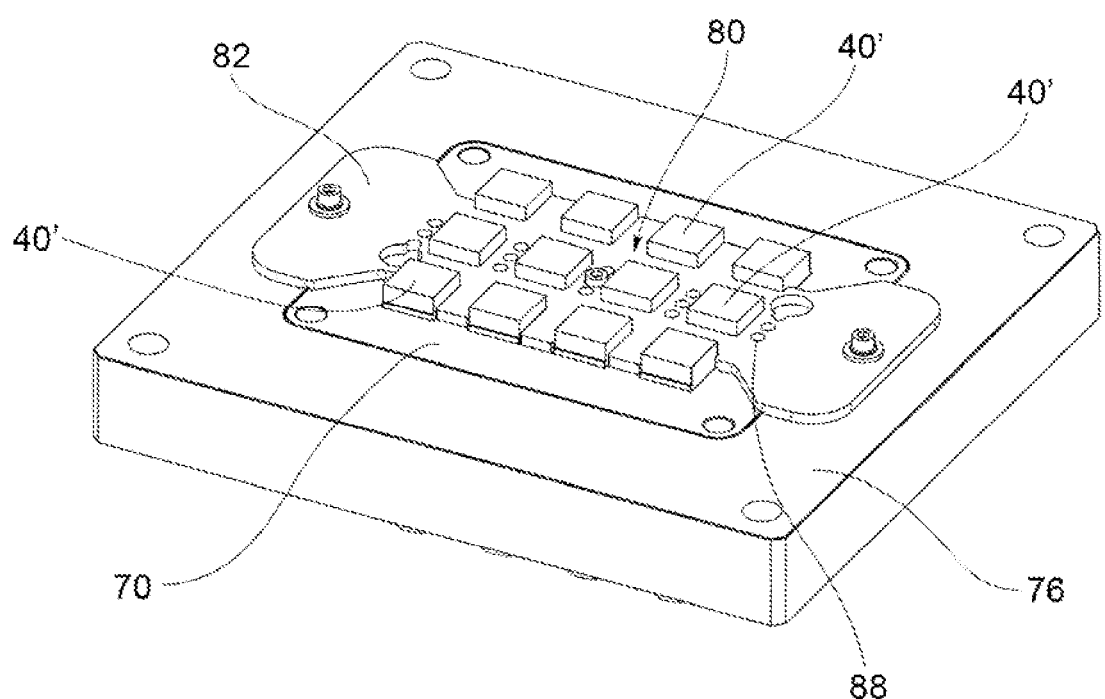
FIG. 3 is a perspective view from the top of the element holder plate.
Figure 4:
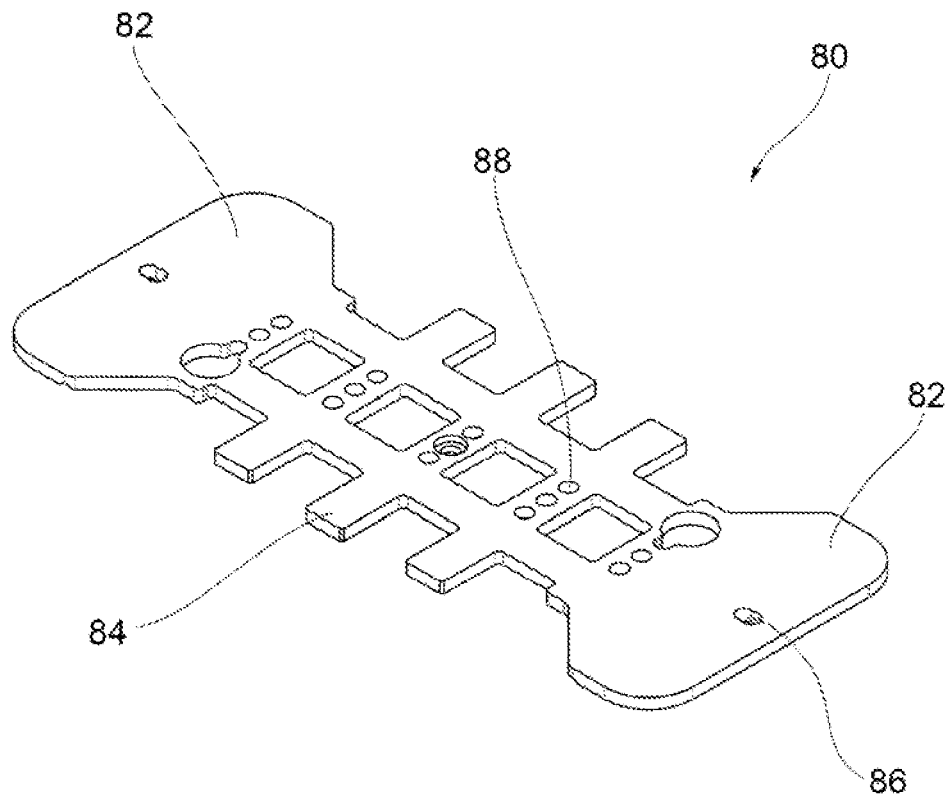
FIG. 4 shows, in perspective view, the sole heat diffusion plate associated with the element holder plate.
Figure 5:
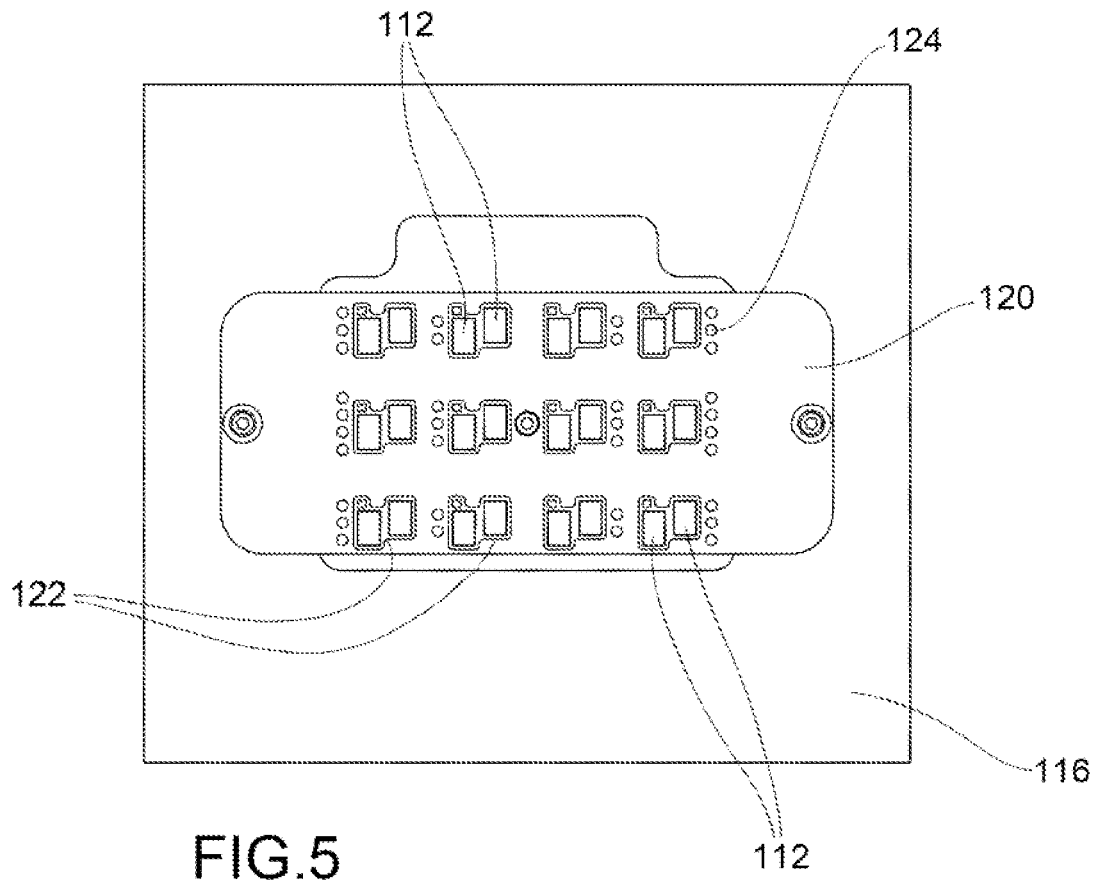
FIG. 5 is a plan view from the top of the presser holder plate fitted with a heat diffusion plate.
Figure 6:
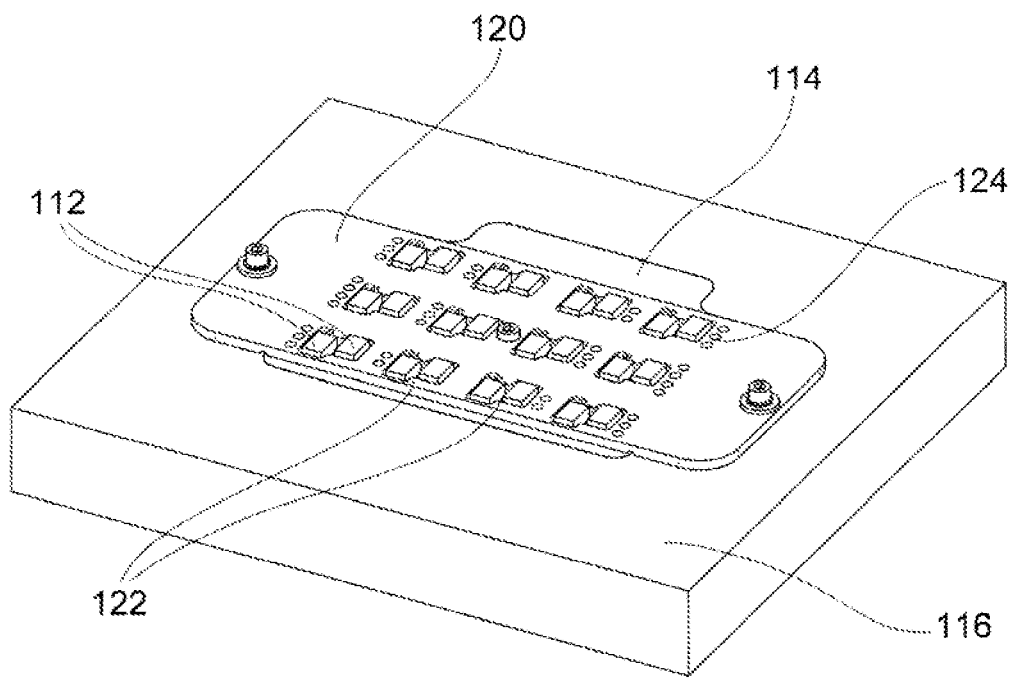
FIG. 6 is a perspective view from the top of the presser holder plate.

In said drawings, a sintering press according to the invention has been indicated collectively at 1.

The press is suitable for sintering electronic components 10 on a substrate 12.

In one embodiment, the press 1 is designed to perform the simultaneous sintering of electronic components on a plurality of substrates 12.

The substrates 12 hold the electronic components 10 to be sintered (e.g. IGBTs, diodes, thermistors, MOSFETs) placed on a layer of sintering paste. The components 10 must be processed with a predefined surface pressure, for example 30 MPa, at a predefined temperature, for example 260° C., for 180 to 300 seconds.

The electronic components 10 must be pressed with a force directly proportional to their projection surface, taking into account that the components are of thicknesses varied by families.

The sintering press 1 comprises a framework 8 that extends vertically and supports a pressing unit 14 at the top and a support base 60 at the bottom for at least one substrate 12, preferably a plurality of substrates.

One or both of the pressing unit and the base is movable with respect to the other along a press axis X to bring the electronic components to be sintered 10 substantially in contact with the pressing unit 14 to then carry out the pressing.

In one embodiment, the pressing unit 14 comprises, for each substrate, one or more presser members suitable to apply the necessary sintering pressure on the electronic components.

In one embodiment, the pressing unit 14 comprises a multi-rod cylinder 20 equipped with parallel and independent presser rods 28. Each presser rod 28 is coaxial and barycentric to a respective electronic component 10 to be sintered and has a thrust section proportional to the force to be exerted on the respective electronic component 10, the area of each electronic component to be sintered being known. The term "barycentric" means that each presser rod 28 has a rod axis that coincides with the barycenter of the respective electronic component 10.

In one embodiment, the presser rods 28 are driven by a pressurized control fluid. For example, the presser rods 28 communicate with a compression chamber 30 wherein the control fluid is introduced and wherein a suitable control element is housed to transfer the pressure exerted by the control fluid to the presser rods. For example, this control element is in the form of a membrane 32. When the compression chamber 30 is pressurized to the sintering pressure, the membrane 32 deforms by pressing against the rear ends 28' of the presser rods 28 for a transfer of the sintering pressure to each presser rod 28.

In one embodiment, the pressing unit further comprises a presser heating plate 110 that slidably supports the presser members 112, each of which is operable by a respective presser rod 28 to act on a respective electronic component 10 to be sintered.

In one embodiment, the presser heating plate 110 comprises an inner plate 114 suitable to support slidably the presser members 112 and a presser heating body 116 placed around the inner plate 114 and equipped with heating means 118, for example resistors, to heat the inner plate 114 and thus the presser members 112.

Naturally, other presser rod actuation systems may also be used.

In accordance with one aspect of the invention, the press 1 comprises a plurality of reaction elements 40, each extending along an element axis parallel to the axis X of the press between a first element end 40' and a second element end 40". The first element end 40' forms a support plane for a respective substrate 12.

In one embodiment, a load cell 50 is operatively connected to the second element end 40". The load cell 50 is suitable to detect, by means of the reaction element 40, the force exerted by one or more presser rods 28 of the pressing unit 14 on the electronic components 10 to be sintered located on the substrate 12.

One should note that the load cell 50 may be used, according to the specific requirements, simply to detect that a pressure has been applied to the respective substrate 12, thus in ON/OFF operation mode, or to detect the value of the pressure applied, e.g. by a feedback pressure control.

In one embodiment, the load cell 50 is housed in a cell holder plate 52 operatively connected to a cooling circuit 54.

The reaction elements 40 are supported slidably by an element plate 70. The reaction elements 40 are arranged in an array in the element plate 70. The first end 40' of each reaction element 40 protrudes from the element plate 70.

The term "supported slidably" does not mean that the reaction element 40 must necessarily slide in the element plate 70, but that this element is inserted in a respective guide seat made in the element plate 70 without being bound thereto. In effect, as will be described below, the element plate 70 must ensure heat transmission therefrom to the reaction element 40, keeping the latter in the correct position parallel to the press axis X, but at the same time without affecting the force detected by the respective load cell 50.

One should note that, in a preferred embodiment, the second end 40" of the reaction element 40 is always in contact with the load cell 50 whereby, during the pressing step, the reaction element 40 undergoes a substantially null or negligible axial displacement. In this case, the reaction element 40 provides a real contrast to the force exerted by the presser member, which is then completely absorbed by the electronic components 10 to be sintered.

The element plate 70 must be heated in such a way that, by thermal conduction, the reaction elements are brought to the temperature required for sintering, for example between 240° C. and 290° C.

In one embodiment, each reaction element 40 has a heating portion 40a that passes through the element plate 70 and that is suitable to transmit by conduction the heat of the element plate 70 to the respective substrate 12.

In one embodiment, the reaction element 40 has moreover a cooling portion 40b ending with the second end 40" and shaped in such a way as to dissipate the heat transmitted from the element plate 70 to the heating portion 40a.

For example, the heating portion 40a and the cooling portion 40b are consecutively arranged.

In one embodiment, the heating portion 40a has an axial extension substantially equal to or slightly greater than the thickness of the element plate 70. For example, the heating portion 40a ends with the first end 40' of the reaction element, which protrudes axially from the element plate 70.

For heating the element plate 70, the press comprises a heating circuit 72 comprising heating elements embedded in a heating body 76 placed around the element plate 70.

For example, the heating circuit 72 comprises electrical resistors controlled by resistance thermometers.

In accordance with one aspect of the invention, the press 1 further comprises a heat diffusion plate 80 placed in contact with the heating body 76 and extending on the element plate 70, among the reaction elements 40.

The diffusion plate 80 is made of a material with a higher thermal conductivity than that of the element plate 70.

For the element plate 70, in effect, a material is used, for example steel, which favors mechanical performance, in particular strength, rather than thermal conductivity.

For example, the diffusion plate 80 is made of copper, while the element plate 70 is made of steel.

Copper has a thermal conductivity coefficient $\lambda$ ($W \cdot m^{-1} \cdot K^{-1}$) of 390 compared to the 60 of steel from which the element plate 70 is made.

In one embodiment, the diffusion plate 80 comprises at least two end heat collectors 82, opposite each other and fixed, each astride the heating body 76 and the element plate 70.

In one embodiment, the diffusion plate 80 further comprises a central grid 84, for example directly connected to the two end heat collectors 82, which extends with contact on the plate elements 70 surrounding the first ends 40' of the reaction elements 40.

In one embodiment, the diffusion plate 80 is fixed to the heating body 76 and the element plate 70 in a detachable manner with play, i.e. in a slidable manner, for example, by means of bolts engaging slotted holes 86 in the diffusion plate 80, in order to facilitate the different thermal expansions of the element plate and the heating body.

In one embodiment, the diffusion plate 80 also has compensation holes 88 shaped and/or positioned in such a way as to ensure uniform heating of all the reaction elements 40.

In one embodiment, the element plate 70 is separable from the heating body 76. In this way, the element plate may be replaced with another, as a function of the number and shape of the substrates to be sintered 12.

In one embodiment, the element plate 70 and the cell holder plate 52 are separated axially from each other by a separation fluid suitable to dissipate the heat of the reaction element, for example air.

For example, the cooling portion 40b has an extension substantially equal to the distance between the element plate 70 and the cell holder plate 52.

In one embodiment, the heating portion 40a is prism-shaped. For example, the heating portion 40a has an axial extension greater than the diameter of the support plane of the substrate.

In one embodiment, the cooling portion 40b comprises an axial succession of dissipating disks 44 that extend coaxially to the element axis.

In one embodiment, the second end 40" of the reaction element 40 is equipped with an infrared screen 46 facing the load cell 50.

In one embodiment, the cooling circuit 54 is suitable to keep the cell holder plate at a temperature of about 25° C.

For example, the cooling system is based on the circulation of a coolant conditioned by a chiller.

The reaction element 40, combined with the heatable element plate 70 and the coolable cell holder plate, therefore allows to:

provide for the heating of the sintered substrate through the transmission of heat by conduction from the element plate to the heating portion of the reaction element;

counteract the sintering pressure applied by the upper presser members;

transmit the counteracting force to the load cell;

reduce the heat transmission to the load cell.

The cooling circuit may therefore keep the load cell at an acceptable working temperature, for example 60° C. without excessive energy expenditure.

In one embodiment, a second diffusion plate 120 is placed in contact with the presser heating body 116 and extends over the inner plate 114, between the presser members 112. In other words, the second diffusion plate 120 has a plurality of openings 122 through which the upper ends of the presser members 112 protrude to be engaged by the presser rods 28.

The second diffusion plate 120 is also made of a material with a higher thermal conductivity than the inner plate 114, which for example is made of steel.

For example, also the second diffusion plate 120 is made of copper.

In one embodiment, the second diffusion plate 120 is fixed to the presser heating body 116 and to the inner plate 114 in a detachable manner with play, i.e. in a slidable manner, for example, by means of bolts engaging slotted holes of the second diffusion plate 120, in order to facilitate the different thermal expansions of the inner plate and the presser heating body.

In one embodiment, in the second diffusion plate 120 compensation holes 124 are also made, shaped and/or positioned in such a way as to ensure uniform heating of all the presser members 112.

To the embodiments of the sintering press according to the invention, a person skilled in the art, to satisfy contingent needs, may make modifications, adaptations and replacements of elements with others that are functionally equivalent, without departing from the scope of the following claims. Each of the features described as belonging to a possible embodiment may be implemented independently from the other described embodiments.

The invention claimed is:

1. A sintering press for sintering electronic components on a substrate, the sintering press comprising:

a pressing unit comprising a plurality of controllable presser members for applying a sintering pressure to the electronic components to be sintered;

a plurality of reaction elements, each reaction element of said plurality of reaction elements extending predominantly along an element axis parallel to a pressing axis of the sintering press between a first element end and a second element end, wherein the first element end forms a support plane for a respective substrate;

an element plate suitable for slidably supporting the reaction elements, the reaction elements being arranged in a matrix in said element plate, each reaction element having the first element end protruding from said element plate;

a heating circuit comprising heating elements embedded in a heating body placed around the element plate to bring the element plate to a sintering temperature; and a heat diffusion plate placed in contact with the heating body and extending onto the element plate between the reaction elements, the heat diffusion plate being made of a material having a higher thermal conductivity than the element plate.

2. The sintering press of claim 1, wherein the heat diffusion plate comprises at least two end heat collectors, opposite each other and fixed, each end heat collector straddling the heating body and the element plate, and a central grid that extends with contact on the element plate surrounding the first element ends of the reaction elements.

3. The sintering press of claim 1, wherein the pressing unit further comprises a presser heating plate slidably supporting presser members, each presser member being operable by a corresponding presser rod to act on a respective electronic component to be sintered, the presser heating plate comprising an inner plate suitable for slidably supporting the presser members and a presser heating body placed around the inner plate and provided with resistors to heat the inner plate and the presser members.

4. The sintering press of claim 3, wherein the pressing unit comprises a second diffusion plate placed in contact with the presser heating body and extending on the inner plate, between the presser members, said second diffusion plate being made of a material having a higher thermal conductivity than the inner plate.

5. The sintering press of claim 4, wherein the heat diffusion plate and the second diffusion plate are made of copper.

6. The sintering press of claim 1, wherein the heat diffusion plate is fixed in a removable way and with play to respective heating body and to respective plate.

7. The sintering press of claim 1, wherein air flow holes are formed in the heat diffusion plate, said air flow holes being shaped and positioned so as to guarantee uniform heating of all the reaction elements and/or all the presser members.

8. The sintering press of claim 1, wherein the element plate is separable from the heating body.

9. The sintering press of claim 1, further comprising a plurality of load cells, each load cell being operatively connected to the second element end, so that said load cell detects, by the reaction element, a force exerted by one or more presser members, the load cell being housed in a cell holder plate operatively connected to a cooling circuit.

10. The sintering press of claim 1, wherein each reaction element has a heating portion that passes through the element plate and is suitable for transmitting by conduction heat of the element plate to the substrate, and a cooling portion ending with the second element end and shaped so as to dissipate the heat transmitted from the element plate to the heating portion.

11. The sintering press of claim 10, wherein the cooling portion comprises an axial succession of dissipating disks that extend coaxially to the element axis.

12. The sintering press of claim 1, wherein the second element end of the reaction element is equipped with an infrared screen facing the load cell.

* * * * *